US007514114B2

(12) United States Patent
Wong et al.

(10) Patent No.: US 7,514,114 B2
(45) Date of Patent: Apr. 7, 2009

(54) DETECTING DEFECTIVE EJECTOR IN DIGITAL LITHOGRAPHY SYSTEM

(75) Inventors: William S. Wong, San Carlos, CA (US); Steven E. Ready, Mountain View, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 834 days.

(21) Appl. No.: 11/218,416

(22) Filed: Sep. 1, 2005

(65) Prior Publication Data

US 2007/0046705 A1 Mar. 1, 2007

(51) Int. Cl.
*C23C 16/52* (2006.01)
*B05D 5/12* (2006.01)

(52) U.S. Cl. .............................. 427/8; 427/58; 347/14; 347/43; 347/54

(58) Field of Classification Search ..................... 427/8, 427/58; 347/14, 43, 54
See application file for complete search history.

(56) References Cited

U.S. PATENT DOCUMENTS 5,771,810 A * 6/1998 Wolcott ..................... 101/483
6,617,261 B2 9/2003 Wong et al.
6,669,322 B2 12/2003 Gaston et al.
6,742,884 B2 6/2004 Wong et al.
6,834,586 B1 * 12/2004 Ohsawa et al. ............. 101/466

* cited by examiner

*Primary Examiner*—Shamin Ahmed
(74) *Attorney, Agent, or Firm*—Bever, Hoffman & Harms, LLP; Patrick T. Bever

(57) ABSTRACT

A digital lithography system prints a large-area electronic device by dividing the overall device printing process into a series of discrete feature printing sub-processes, where each feature printing sub-process involves printing both a predetermined portion (feature) of the device in a designated substrate area, and an associated test pattern in a designated test area that is remote from the feature. At the end of each feature printing sub-process, the test pattern is analyzed, e.g., using a camera and associated imaging system, to verify that the test pattern has been successfully printed. A primary ejector is used until an unsuccessfully printed test pattern is detected, at which time a secondary (reserve) ejector replaces the primary ejector and reprints the feature associated with the defective test pattern. When multiple printheads are used in parallel, analysis of the test pattern is used to efficiently identify the location of a defective ejector.

12 Claims, 7 Drawing Sheets

DETECTING DEFECTIVE EJECTOR IN DIGITAL LITHOGRAPHY SYSTEM

FIELD OF THE INVENTION

This invention was made with Government support under 70NANBOH3033 awarded by NIST/ATP. The Government has certain rights in this invention. Further, this invention relates to generally to the field of integrated circuit (IC) device processing and, more particularly, to digital lithographic techniques where a surface is masked by ejecting droplets of a phase-change masking material from a droplet source in accordance with predetermined printing data.

BACKGROUND OF THE INVENTION

In recent years, the increasingly widespread use of display device alternatives to the cathode ray tube (CRT) has driven the demand for large-area electronic arrays. In particular, amorphous silicon and laser re-crystallized polycrystalline silicon (poly-silicon) are used to drive liquid crystal displays commonly used in laptop computers. However, fabricating such large-area arrays is expensive. A large part of the fabrication cost of the large-area arrays arises from the expensive photolithographic process used to pattern the array. In order to avoid such photolithographic processes, direct marking techniques have been considered an alternative to photolithography.

An example of a direct marking technique used in place of photolithography involves utilizing a xerographic process to deposit a toner that acts as an etch mask. However, toner materials are hard to control and difficult to remove after deposition.

Another example of a direct marking technique involves "digital lithography" in which a droplet source including, for example, an inkjet printhead, is used to deposit a liquid mask onto a substrate in accordance with predetermined printing data. A problem with digital lithography is that inkjet printing of functional devices is susceptible to several defect creation processes during the printing operation: misdirected ejection, ejection failure, droplet/spot size variation, alignment error, etc. In most device printing applications, single defects, depending on their nature, will result in a device that will not function to specifications.

It is highly desirable to develop robust digital lithography systems that maximize yields. Currently, the method of quality control for micro electronic and optical pattern formation by digital lithography involves post-printing inspection of the pattern after the entire substrate is patterned. While post-printing inspection facilitates finding printing errors caused by a defective printhead/ejector, the location of the defective printhead/ejector may not be readily apparent when the defective printhead/ejector is one of several printheads/ejectors operating in parallel, thus making it necessary to both scrap the defective substrate and to perform a separate test to identify the defective printhead/ejector prior to resuming production. In rare instances, after finding and replacing the defective printhead/ejector, post-processing of the defective substrate may be attempted to correct printing errors. However, such corrections are performed well after deposited materials have gone through a phase change (i.e., assumed a solid form), thereby producing inferior correction results because the corrective liquid mask may not adhere well to the already-solid mask material.

What is needed is a multi-ejector digital lithography system that identifies a defective ejector immediately after its failure, and initiates immediate corrective action, thereby minimizing interruption of the printing process and producing superior corrective results. What is also needed is a method for identifying a defective ejector from a plurality of parallel ejectors, and to deactivate the defective ejector and activate an associated redundant ejector in a manner that minimizing interruption of the printing process.

SUMMARY OF THE INVENTION

The invention is directed to a digital lithography system for printing large-area electronics on a substrate that detects failure of a primary ejector by inducing the primary ejector to periodically print test patterns in remote test areas, and analyzing the test patterns to identify failure of the primary ejector. The overall device printing operation is broken into a sequence of discrete printing sub-processes, where a predefined feature (e.g., a printed structure that is collectively utilized with other features to produce the device) is printed during each printing sub-process. In accordance with the present invention, in addition to printing a particular feature onto its associated substrate region, each printing sub-process involves printing a test pattern onto a designated test area that is remote from the feature printing area. That is, after inducing the primary ejector to print the feature associated with a printing sub-process, the droplet source (printhead) is moved over a predetermined test area (which may be an unused portion of the substrate, or located off of the substrate), and the primary ejector is induced to print the associated test pattern before executing the next sequential printing sub-process. In this manner, multiple test patterns are printed (or attempted to be printed) during each device print operation. In accordance with another aspect of the present invention, each test pattern is analyzed immediately after its printing is attempted to verify that the test pattern has been successfully printed. Test pattern analysis is performed, for example, using a digital camera arranged to capture an image of the test pattern, and an associated optical system that compares the captured test pattern image data with stored "expected" image data. By printing test patterns in relatively blank test areas (i.e., instead of trying to determine printing defects in the relatively cluttered device area), the test pattern analysis is relatively easy to perform. When successful printing of the just-printed test pattern is determined, the printing operation is resumed using the primary ejector (i.e., the primary ejector is moved over a second region of the substrate associated with the next sequential sub-process, and induced to print a next sequential feature). When a defective (e.g., missing, misshapen, or misplaced) test pattern is detected, failure of the primary ejector is assumed to have occurred sometime before or during the current printing sub-process. Because test patterns are printed after each feature, failure of the primary selected ejector can be identified almost immediately after the failure occurs. The defective primary ejector is then deactivated, and a reserve (second) ejector is induced to re-print the feature associated with the detected defective test pattern (i.e., the current printing sub-process is repeated), thereby initiating an immediate corrective action that minimizes interruption of the printing operation, and produces superior corrective results.

In accordance with an embodiment of the present invention, the digital lithography system utilizes an inkjet printhead array including multiple inkjet printheads operated in parallel, where each inkjet printhead includes four ejectors. When printing operation of a large-area electronic device is started, a primary ejector of each printhead is selected, the inkjet printhead array is moved over a selected region of a substrate, and a device feature is printed by inducing the primary ejector of each of the printheads to eject associated droplets in parallel that collectively form the feature. The printhead array is then moved over a designated test area, and all of the primary ejectors are induced to print one droplet or a few droplets, which collectively form a test pattern. An image of the test pattern is then captured by a digital camera and compared by an associated optical system with stored "expected" image data. When one of the primary ejectors fails, the defective ejector is identified by the location of the missing or otherwise defective droplet in the test pattern. The defective ejector is then deactivated and replaced by a secondary ejector located on the same inkjet printhead, which is arranged to print droplets onto the same location as the primary ejector. The printhead array is then moved back over the previous region, and the newly-activated secondary ejector is actuated to print (the remaining "good" (operable) primary ejectors remain unactuated during this process), thus assuring correction of the associated feature by reprinting the entire feature using the secondary ejector. Normal parallel printing is then resumed using the "good" primary ejectors, but using the secondary ejector in place of the defective primary ejector.

In additional embodiments, printing tasks are shifted from a defective printhead to a reserve printhead, or a "good" printhead is used in a two-pass printing process to print both its primary feature portion and a portion associated with a defective printhead.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

As used herein, the terms "phase-change masking material" and "phase-change material" refer to compounds or elements that changes in phase from a liquid to a solid, or in some embodiments from a liquid to a gas. In one embodiment of the invention, the phase change material have low melting points (also called freezing point) below 150° C. with a narrow transition temperature range. The phase-change masking material may also be mixtures or dispersions without precise freezing temperatures. However, even without specific freezing temperatures, these materials still retain the characteristic of transitioning from a substantially liquid phase to a substantially solid phase in a narrow temperature range. In one particular embodiment of the invention, the phase change material is an organic material such as a wax that has a melting point between 60 degrees and 100 degrees centigrade. An additional characteristic of the phase-change masking material is that a mask formed by the phase-change masking material should be robust enough to withstand wet-chemical or dry etching processes. When a dry etching process is used, phase change masking materials with low-vapor pressures may be used. Wax is an example of a phase-change material with the previously described characteristics. Examples of suitable waxes for use as a phase-change masking material are Kemamide 180-based waxes from Xerox Corporation of Stamford, Conn.

As used herein, the term "feature" is intended to mean a structure printed onto a substrate during the lithography process that contributes either to directly form a part of the completed device (i.e., a conductive line structure), or is otherwise temporarily used (e.g., as an etch mask) to define parts of the completed device. Each feature includes one or more droplets that may be separated or contiguous.

As used herein, the term "induced" or "actuated" in the context of ejector operation is intended to mean that the ejector is subjected to mechanical conditions and electrical signals consistent with the ejection of a droplet from the induced or actuated ejector. For example, both defective and operable ejectors may be induced/actuated using identical electrical signals to print a droplet, but only the operable ejector will successfully produce a droplet.

Figure 1:
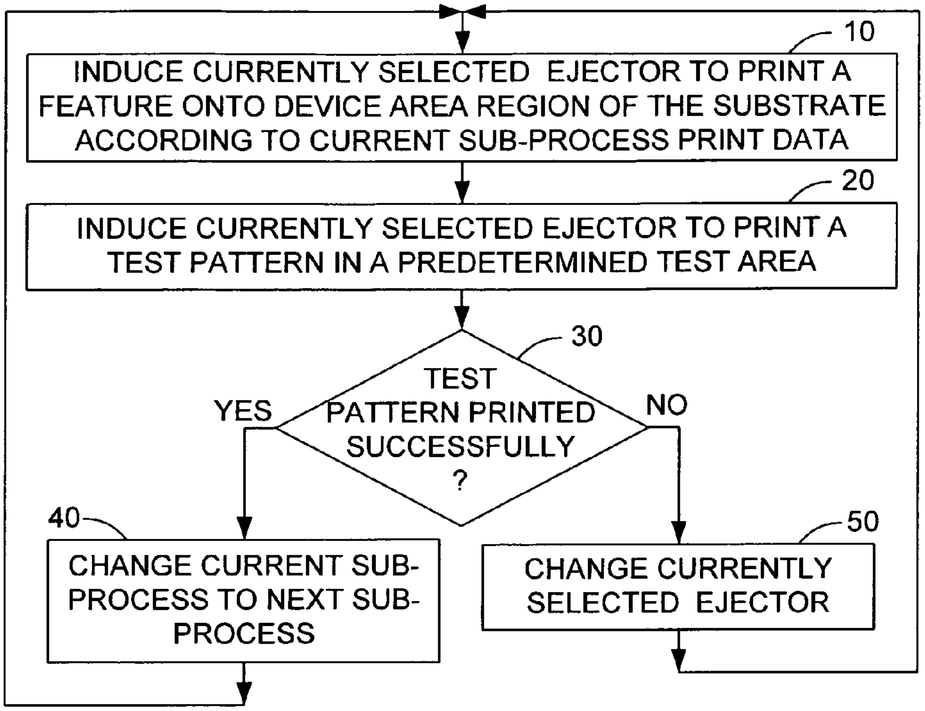
FIG. 1 is flow diagram showing a method for producing large-area electronic devices according to an embodiment of the present invention.

FIG. 1 is a flow diagram depicting a simplified method for printing a large-area electronic device on a substrate according to a simplified embodiment of the present invention. Before the printing operation is performed, known techniques are used to separate the overall device printing operation into a sequence of discrete printing sub-processes such that each printing sub-process includes print data for controlling a digital lithography system to print of an associated feature of the large-area electronic device. The print data for each sub-process includes the region (location) of the device substrate for the associated feature (e.g., a start position associated with a first droplet, a stop position associated with a final droplet, and intermediate positions associated with intermediate droplets). Also, before the printing operation is performed, a first ejector of the digital lithography system is selected to serve as a primary ejector, and a second ejector of the digital lithography system is designated to serve as a secondary ejector. Referring to block 10 of FIG. 1, at the beginning of each sub-process, the currently selected (e.g., primary) ejector is induced to print that sub-process' feature onto the device area region designated by the associated print data. Next, as indicated in block 20, according to an aspect of the present invention, the currently selected ejector is moved away from the just-printed feature and induced to print a predetermined test pattern (i.e., droplet or series of droplets) in a predetermined test area either located on an otherwise unused portion of the substrate, or on a structure located next to the substrate. A sensing system (e.g., the optical system described below, or another type of sensing apparatus such as a scanner system) is used to determine if the test pattern was successfully printed (see decision block 30). If the test pattern was successfully printed (the YES branch from decision block 30), then the printing operation proceeds with executing the next sequential sub-process using the currently selected (e.g., primary) ejector (block 40). Conversely, if the test pattern was unsuccessfully printed (the NO branch from decision block 30), then the currently selected (primary) ejector is de-activated and the reserve (secondary) ejector is activated (block 60), and then the secondary ejector is induced to re-print the feature associated with the current sub-process. The secondary ejector is then used as the currently selected printer during the execution of subsequent printing sub-processes.

Figure 2:
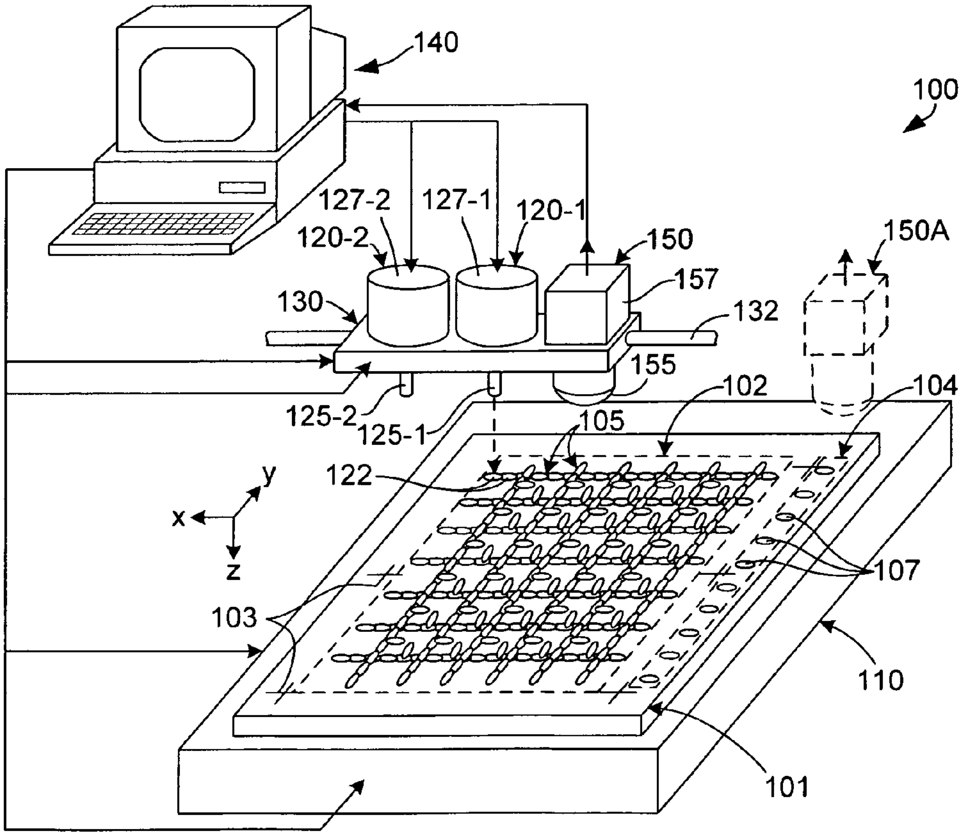
FIG. 2 is a partial prospective view showing a simplified digital lithography system for implementing the method of Claim 1 according to another embodiment of the present invention.

FIG. 2 is a perspective view showing a simplified digital lithography system 100 that is provided to illustrate an exemplary printing operation performed in accordance with the method of FIG. 1. Digital lithography system 100 generally includes a platen 110 for supporting a substrate 101 below at least two printheads (droplet sources) 120-1 and 120-2, which are suspended over platen 110 by way of a support structure 130. In a manner similar to conventional digital lithography systems, printing operations performed by printheads 120-1 and 120-2 are controlled by a digital control system 140 (e.g., a computer or other logic circuit programmed or otherwise configured to perform the various functions described herein). During these printing operations, droplets 122 of phase-change masking material are ejected in the z-axis direction onto the upward facing surface of substrate 101 while substrate 101 and printheads 120-⁄1;2 are moved relative to each other in the x-axis and/or y-axis directions, whereby printed features 105 (i.e., structures formed by contiguous droplets 122) are deposited and solidify on the upper surface of substrate 101.

Substrate 101 typically includes a thin film of semiconductor material or a thin-film metal such as aluminum, but may comprise other materials, such as a flexible sheet. Substrate 101 is maintained at a temperature such that droplets 122 cool and solidify (i.e., undergo a phase change) after deposition. In some embodiments of the invention, a wetting agent, typically a dielectric material such as silicon dioxide, $SiO_2$ or silicon nitride, $Si_3N_4$ may be included on the surface to assure that sufficient wetting occurs to make a good contact between the mask and the substrate.

Platen 110 and support structure 130 cooperatively form a positioning apparatus that is controlled by digital control system 140 to operably position either "primary" printhead 120-1 or "secondary" printhead 120-2 relative to a selected region of substrate 101 during the printing operation (the designation of "primary" and "secondary" is arbitrary and may be reversed). In particular, digital control system 140 transmits positional commands to at least one of platen 110 and support structure 130, whereby primary printhead 120-1 is moved in the X-axis and Y-axis directions until it is operably positioned over a predetermined substrate location of substrate 101 for ejection of a droplet. After a droplet of marking material is deposited on substrate 101, the relative positions of substrate 101 and primary printhead 120-1 are adjusted to reposition primary printhead 120-1 over a second position. The positioning and repositioning operations may be achieved either by moving primary printhead 120-1 or by moving substrate 101 via platen 110. In one embodiment, a motor moves support structure 130 along at least one rail 132 in a predetermined X-axis and/or Y-axis direction pattern over substrate 101, thereby positioning primary printhead 120-1 over the predetermined substrate locations. Alternatively, or in addition, substrate 101 is positioned relative to primary printhead 120-1 by way of a motor and rail system (not shown) that moves platen 110 in the X-axis and/or Y-axis directions. For brevity, either of these positioning actions is described herein in terms of movement of primary printhead 120-1 or secondary printhead 120-2. In addition, during actuation, digital control system 140 transmits print (ejection) commands to one of printheads 120-1 or 120-2 such that phase-change masking material droplets 122 are selectively ejected in liquid form onto predetermined substrate location once the positioning operation is completed, thereby causing the elected droplets 122 to form at least part of a printed feature 105 at the predetermined substrate location. By coordinating the movement of printheads 120-1 and 120-2 with the timing of droplet source outputs, a masking pattern (printed feature) is "printed" on substrate 101.

As indicated in FIG. 2, in the current embodiment, primary printhead 120-1 includes an associated primary ejector 125-1, and secondary printhead 120-2 includes an associated secondary ejector 125-2 for ejecting droplets 122, an associated reservoir 127-1 and 127-2 for holding the phase-change masking material in a liquid form, and a conduit (not shown) for feeding the liquid phase-change masking material from reservoirs 127-1 and 127-2 to ejectors 125-1 and 125-2. Ejectors 125-1 and 125-2 include respective driver circuits that operate in response to the print commands received from digital control system 140 to eject droplets onto substrate 101. Reservoirs 127-1 and 127-2 typically include a heat source (not shown) that the phase-change masking material to a temperature that is sufficient to maintain the phase-change masking material in a liquid state until it is ejected by a selected one of primary ejector 125-1 and secondary ejector 125-2 onto a designated surface (e.g., substrate 101). Printheads 120-1 and 120-2 may be implemented using a variety of technologies including traditional ink-jet technology (i.e., an ink-jet printhead). An alternative technology well-suited for generating extremely small droplet sizes is the use of sound waves to cause ejection of droplets of masking material as done in acoustic ink printing systems. In acoustic in printing systems, a source of acoustic waves, such as a piezo-electric driver, generates acoustic waves in a pool of liquid phase change masking material. An acoustic lens focuses the acoustic waves such that a droplet of phase change masking material is ejected from the surface of the liquid pool. The droplet is then deposited on substrate 101 as described above.

In order to minimize the possibility of partial midair freezing of droplets in the Z-axis space between ejectors 125-1 and 125-2 and substrate 101, an electric field may be applied to accelerate droplets 122 from ejectors 125-1/2 to substrate 101. The electric field may be generated by applying a voltage, typically between one to three kilovolts between ejectors 125-1 and 125-2 and a platen 110 under substrate 101. The electric field minimizes droplet transit time through space and allows substrate surface temperature to be the primary factor controlling the phase change operation. Moreover, the increased droplet velocity in space improves the directionality of the droplet allowing for improved straight-line features.

To implement the test pattern analysis portion of the printing operation, digital lithography system 100 further includes an imaging system 150, which functions to generate image data associated with a just-printed test pattern, and to transmit this image data to digital control system 140 for real-time analysis. In one embodiment, imaging system 150 includes a digital camera having a lens 155 and image data generating circuitry 157 that are mounted on support platform 130 (i.e., fixedly connected to droplet sources 120-1 and 120-2 by way of rigid support platform 130). In particular, lens 155 is mounted next to printheads 120-1 and 120-2 and arranged such that lens 155 captures images from the test area 104, which is located directly below ejectors 125-1 and 125-2 when each test pattern in printed, whereby imaging system 150 is configured to selectively capture images (pictures) of predetermined test area 104 immediately after a selected one of ejectors 120-1 and 120-2 ejects a particular droplet 122 onto the associated test area location. Each successive image (still picture) captured by lens 155 is converted into associated digital image data by circuitry 157 using known techniques, and then circuitry 157 transmits the image data to digital control system 140. By mounting imaging system 150 next to droplet sources 120-1 and 120-2 on support platform 130, lens 155 is tightly mechanically coupled to printheads 120-1 and 120-2 with sufficient relative accuracy to insure positional accuracy between the image data portions and the predetermined surface locations on which droplets are printed at each stage of the digital lithography procedure. Alternatively, as indicated in dashed lines to the right of platform 130 in FIG. 2, imaging system 150 may be fixedly mounted directly over test area 104.

In accordance with another aspect of the present invention, digital control system 140 compares the image data provided by imaging system 150 with stored (i.e., expected or "known good") image data. In a manner well known in the art, digital control system 140 includes a memory that receives and stores the captured image data and stored image data. In accordance with a predetermined process executed by digital control system 140, image data portions captured at predetermined stages of the printing process by imaging system 150 are stored in this memory, and then compared with stored image data portions representing expected captured image data at each of the predetermined stages. Comparison algorithms could use stored image parametric information to perform the comparison process, or pattern information from the design file used in the rendering the pattern to be printed, or a prototypical pattern gathered from imaged features formed on the substrate periphery.

Figure 3A:
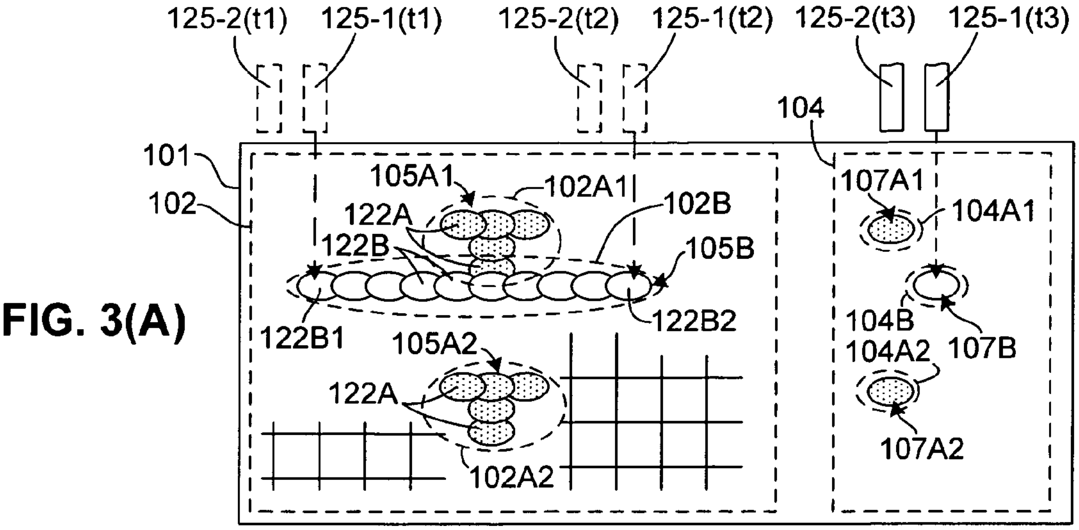
FIGS. 3(A), 3(B) and 3(C) are simplified plan views showing features and test patters printed by the digital lithography system of FIG. 2 in accordance with the method of FIG. 1.
Figure 3B:
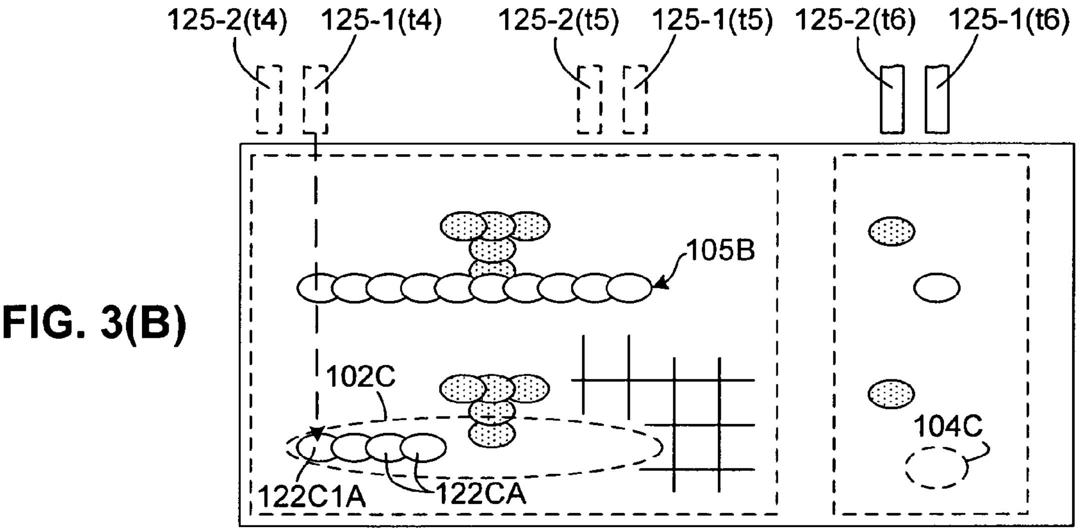
Figure 3C:
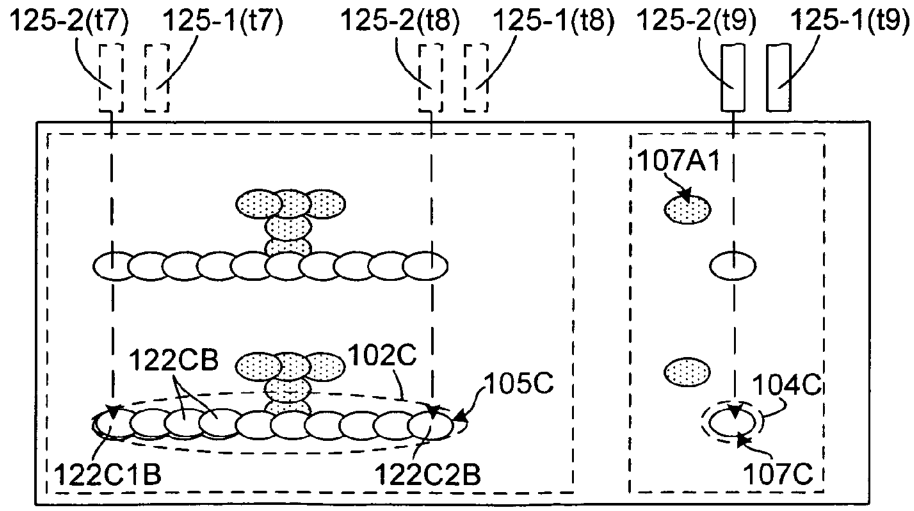

FIGS. 3(A) to 3(C) are simplified diagrams illustrating the partial production of a large-area electronic device in accordance with the method of FIG. 1 and using digital lithography system 100 of FIG. 2. These figures depict a portion of substrate 101, and ejectors 125-1 and 125-2 positioned over substrate 101 during the printing operation. Other structures and details of digital lithography system 100 are omitted for clarity.

FIG. 3(A) depicts the successful execution of a printing sub-process associated with printing a feature 105B in a selected region 102B of substrate 101, and the printing of an associated test pattern 107B in an associated test region 104B. The printing sub-process associated with feature 105B is executed after other sub-processes are executed to generate features 105A1 and 105A2 and associated test patterns 107A1 and 107A2. Additional features that have already been printed are represented in a simplified manner by vertical and horizontal lines. Note that features 105A1 and 105A2 (both made up of droplets 122A) are printed in regions 102A1 and 102A2, respectively, of main device area 102, and test patterns 107A1 and 107A2 are printed in associated regions 104A1 and 104A2 of test area 104. The purpose for showing these previously printed features and test patterns is to illustrate that the regions in which the features are printed are often overlapping and crowded, thereby making optical verification of the features themselves difficult. In contrast, the test patterns printed in test area 104 can be spaced apart, making optical analysis relatively easy to execute. Accordingly, the present invention greatly simplifies the detection of a failed ejector by inducing selected ejector(s) of a digital lithography system to print test patterns in a test area that is remote from the main device printing area.

As indicated in block 10 of FIG. 1, the printing sub-process begins by inducing the selected ejector (in this example, primary ejector 125-1) to print associated feature 105B. Referring to the left side of FIG. 3(A), at an initial time t1 (i.e., the beginning of the printing sub-process), selected primary ejector 125-1 is positioned over a first location of selected region 102B, and is induced to eject (print) a droplet 122B1 onto the first location. Note that secondary ejector 125-2 is fixed relative to ejector 125-1, and is therefore also located substantially over the first location, but is inactive (not induced to generate a droplet) at time t1. Subsequent to printing droplet 122B1, primary ejector 125-1 is moved along region 102B and periodically induced to print droplets until, at a time t2, primary ejector 125-1 ejects a final droplet 122B2 at a final location of region 102B, thus completing feature 105B.

As indicated on the right side of FIG. 3(A) and in accordance with block 20 of FIG. 1, upon completing feature 105B and before executing a next sequential printing sub-process primary, ejector 125-1 is moved from region 105B to a point located over an associated test region 104B of test area 104, and induced to print test pattern 107B (which in the present example is a single droplet). The right side of FIG. 3(A) depicts primary ejector 125-1 ejecting at a time t3 over region 104B. Again, secondary ejector 125-2 remains inactive at time t3.

Subsequent to printing test pattern 107B, pursuant to block 30 in FIG. 1, test pattern 107B is analyzed to determined if it was printed successfully. As described above with reference to FIG. 2, in one embodiment, this analysis is performed using image data generated by imaging system 150. In the present example, because test pattern 107B is printed successfully, thus initiating the YES branch from decision block 30, CPU 140 executes a fetch of print data for a next sequential printing sub-process (i.e., consistent with block 40 in FIG. 1), and then initiates execution of this next sequential sub-process beginning with printing the associated feature (block 10 in FIG. 1).

FIG. 3(B) depicts the incomplete (unsuccessful) execution of the subsequent printing sub-process, thus initiating the NO branch from decision block 30 (FIG. 1). In this example, the subsequent printing sub-process involves the printing of a feature that is essentially identical to feature 105B in a selected region 102C. As indicated at the left side of FIG. 3(B), primary ejector 125-1 begins the printing sub-process by ejecting droplet 122C1A at a time t4, and then proceeds to print droplets 122CA across region 102C in a manner similar to that described above. For purposes of this example, primary ejector 125-1 ceases operation (i.e., fails to respond to the print inducing signals) at a point between time t4 and a time t5, which is associated with completion of the feature printing operation. Note that, at time t5, digital lithography system 100 continues to operate as if primary ejector 125-1 were operating normally. Accordingly, primary ejector 125-1 is shifted over test region 104C and printing of an associated test pattern is induced at a time t6. Because primary printer 125-1 is now defective (inoperable), primary printer 125-1 fails to print the associated test pattern, thus leaving test region 104C empty. During the subsequent test pattern detection/analysis, the absence of the associated test pattern is detected, thus initiating the NO branch from decision block 30 (FIG. 1). As indicated in block 50, CPU 140 deactivates primary ejector 125-1 (i.e., ceases transmission of print inducing signals to primary ejector 125-1), and activates secondary ejector 125-2.

Next, as indicated in FIG. 3(C), CPU 140 controls secondary ejector 125-2 to begin printing the current feature onto region 102C (i.e., re-executing the current printing sub-process). In the manner described above, secondary ejector 125-2 is induced to print a first droplet 122C1B at a time t7, and then to continue to print successive droplets 122CB until a final droplet 122C2B is printed at a time t8, thus successfully printing feature 105C. Next, pursuant to block 20, secondary ejector 125-2 is moved over test region 104C and induced to print test pattern 107C. Subsequent analysis indicates that test pattern 107C is printed successfully, thus indicating that feature 105C was printed successfully. Accordingly, the YES branch of block 30 is followed, and a next sequential printing sub-process is executed using secondary ejector 125-2.

As illustrated by the above example, because test patterns 107B and 107C are printed after associated features 105B and 105C, respectively, failure of primary ejector 125-1 can be identified immediately after the failure occurs, thus minimizing the necessary corrective measures to the printing of the most recent feature (i.e., in the above example, feature 105C). Defective primary ejector 125-1 is then deactivated, and reserve secondary ejector 125-2 is induced to re-print feature 105C, thereby initiating an immediate corrective action that minimizes interruption of the printing operation, and produces superior corrective results due to the minimal time between failure of the primary ejector and completion of the corrective action.

The present invention is described above with reference to printing operations utilizing a simplified digital lithography system using a single ejector. In another practical embodiment described below, a digital lithography system utilizes multiple ejectors actuated in parallel to facilitate high throughput printing operations.

Figure 4:
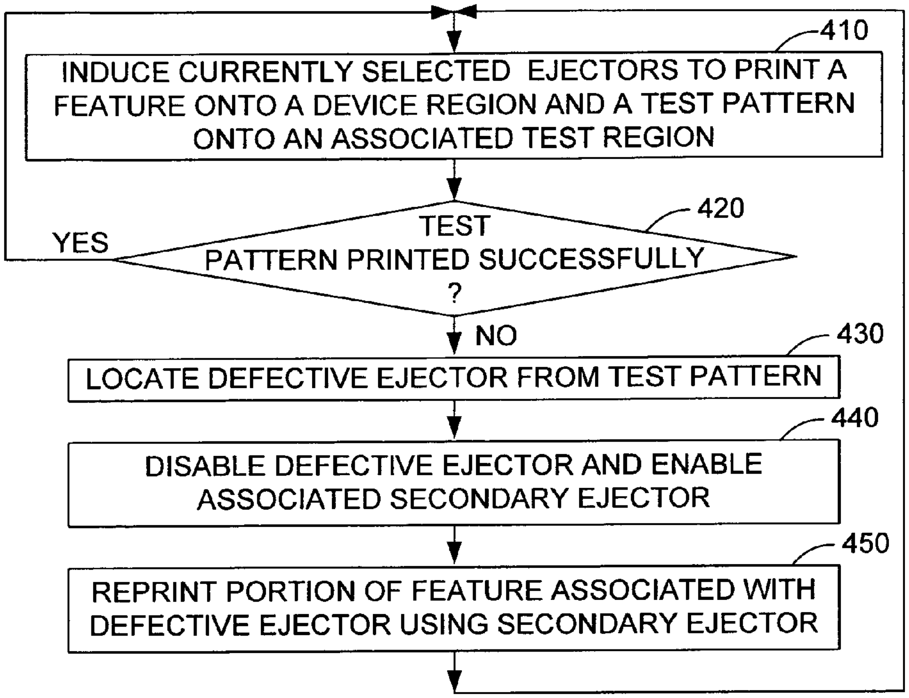
FIG. 4 is a flow diagram showing a method for producing a large-area electronic devices according to another embodiment of the present invention.

FIG. 4 is a flow diagram depicting a simplified method for printing a large-area electronic device on a substrate using a printhead array made up of multiple printheads, where each printhead includes two or more ejectors capable of printing droplets on a selected print location. An exemplary printhead array used in this embodiment is a standard inkjet printhead array that includes including multiple inkjet printheads, where each inkjet printhead includes four ejectors that communicate with four separate reservoirs (e.g., a first ejector for printing black ink, a second ejector for printing blue ink, a third ejector for printing yellow ink, and a fourth ejector for printing red ink). All four ejectors of each printhead are arranged to print droplets of their respective colored ink onto a common print area (i.e., if all four ejectors were actuated simultaneously, the droplets from all four ejectors would print into the same area). Operation of such inkjet printheads in parallel is well known in the inkjet printer art. The modifications needed to use such inkjet printheads in a digital lithography system are minimal. First, all four reservoirs of each printhead are filled with the same material (e.g., a phase-change material). Second, control of the printhead is modified in the manner described below such that only a single selected ejector of each printhead is utilized at any given time.

Similar to the method described above, before a digital lithography operation is started, the operation separated a sequence of discrete printing sub-processes in the manner described above. In addition, the printhead array is configured such that a primary ejector of each multi-ejector printhead is designated and used to perform the printing operation until it fails. Referring to block 410 of FIG. 4, at the beginning of each sub-process, the currently selected (e.g., primary) ejectors of each printhead are induced to print that sub-process' feature onto the device area region designated by the associated print data, and then moved away from the just-printed feature and induced to print a predetermined test pattern in a predetermined test area. A sensing system is used to determine if the test pattern was successfully printed (see decision block 420). If the test pattern was successfully printed (the YES branch from decision block 420), then the printing operation proceeds with executing the next sequential sub-process using the currently selected (e.g., primary) ejectors. Conversely, if the test pattern was unsuccessfully printed (the NO branch from decision block 420), then the location of the defective ejector is determined from the test pattern image data (block 430). Because the test pattern is printed in a relatively blank test area, the location of the defective ejector can be easily determined by locating the position of a missing droplet. Once the location of the defective ejector is determined, a secondary ejector located on the same printhead as the defective ejector is enabled to operate in place of the defective ejector in substantially the manner described above (block 440). The printhead array is then moved over the substrate in a manner consistent with the previously executed printing sub-process, but only the newly-activated secondary printhead is induced to print the feature associated with the deactivated defective primary printhead (block 450), thus effecting a corrective action in an efficient manner that minimizes interruption of the printing operation. Finally, the printing operation is resumed using the secondary ejector and the remaining "good" primary ejectors.

Figure 5:
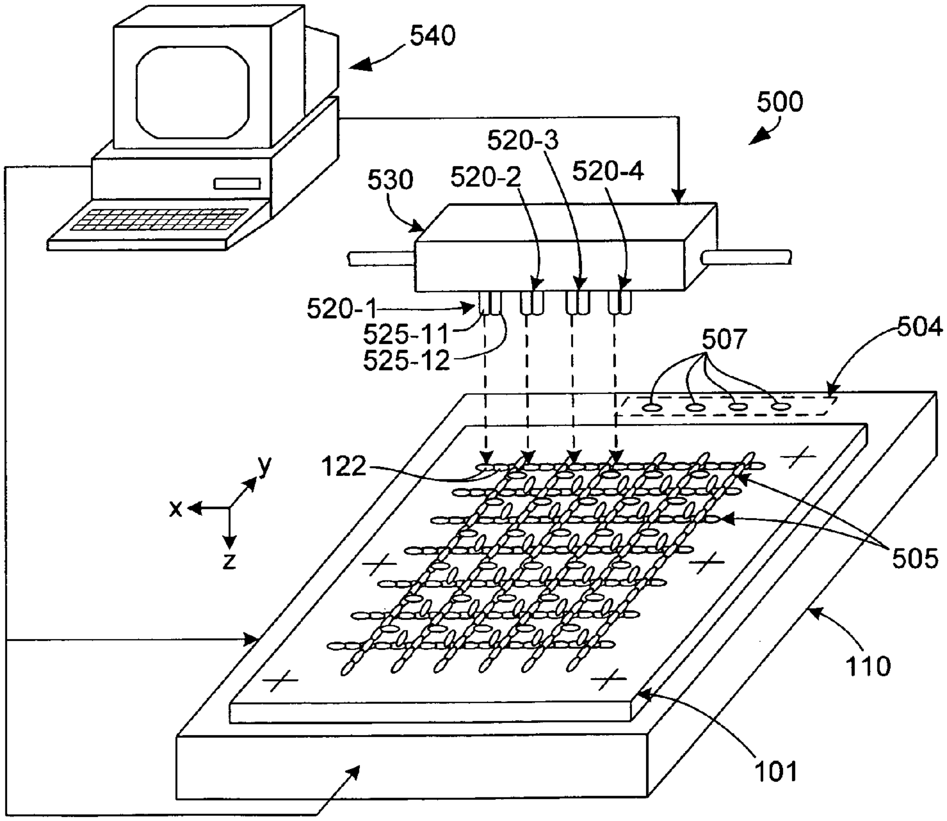
FIG. 5 is a partial prospective view showing a simplified digital lithography system for implementing the method of Claim 4 according to another embodiment of the present invention.

FIG. 5 is a perspective view showing a simplified digital lithography system 500 that is provided to illustrate an exemplary printing operation performed in accordance with the method of FIG. 4. Digital lithography system 500 is similar to digital lithography system 100 (described above) in that it includes a platen 110 for supporting a substrate 101 below a printhead array 530 including multi-ejector printheads 520-1 to 520-4, which are suspended over platen 110 in a manner similar to that described above. For purposes of simplicity, printhead array 530 includes only four printheads 520-1 to 520-4, and each printheads 520-1 to 520-4 is depicted as including two ejectors. For example, as indicated in FIG. 5, printhead 520-1 includes ejectors 525-1 and 525-2. Those skilled in the art will understand that printhead array 530 may include many more printheads, and each printhead may have any number of ejectors. Printheads 520-1 to 520-4 are controlled by a digital control system 540 in a manner consistent with that described below. During these printing operations, droplets 122 of phase-change masking material are ejected in the z-axis direction onto the upward facing surface of substrate 101 while substrate 101 and printheads 520-1 to 520-4 are moved relative to each other in the x-axis and/or y-axis directions, whereby printed features 505 (i.e., structures formed by contiguous droplets 122) are deposited and solidify on the upper surface of substrate 101, and one or more test patterns 507 are printed in a test area 504 that, in this embodiment, is located off of substrate 101. To implement test pattern analysis, digital lithography system 500 further includes an imaging system (not shown) that is similar to imaging system 150 (described above).

FIGS. 6(A) to 6(D) are simplified diagrams illustrating the partial production of a large-area electronic device in accordance with the method of FIG. 4 and using digital lithography system 500 of FIG. 5. These figures depict a portion of substrate 101, and printheads 520-1 to 520-4 of printhead array 530, which respectively include primary printheads 525-11 to 525-41 and secondary printheads 525-12 to 525-42. Other structures and details of digital lithography system 500 are omitted for brevity and clarity.

Figure 6A:
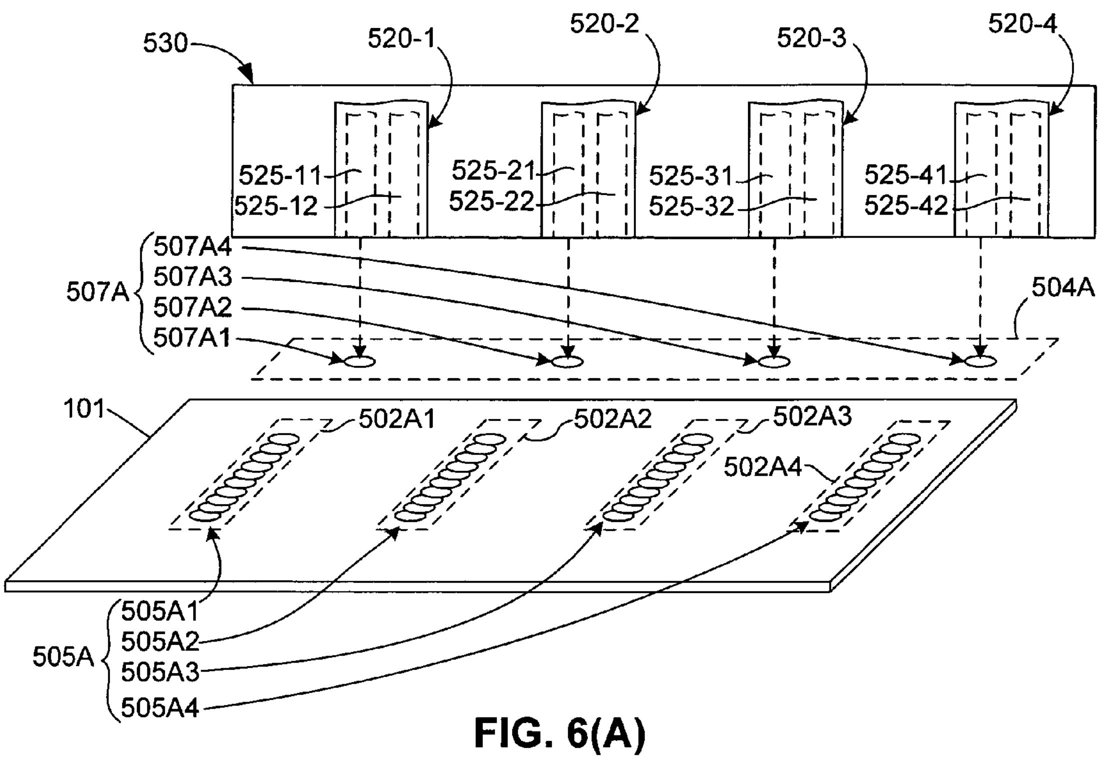
FIGS. 6(A), 6(B), 6(C) and 6(D) are simplified perspective views showing features and test patterns printed by the digital lithography system of FIG. 5 in accordance with the method of FIG. 4.

Consistent with block 410 (FIG. 4), FIG. 6(A) depicts the successful execution of a printing sub-process associated with printing a feature 505A made up of four features portions 505A1 to 505A4 that are respectively printed in selected regions 502A1 to 502A4 of substrate 101, and the printing of an associated test pattern 507A made up of four test pattern portions 507A1 to 507A4 in a predetermined arrangement (e.g., in a straight line) in an associated test region 504A. As indicated in block 420 (FIG. 4), subsequent to printing test pattern 507A, test pattern 507A is analyzed to determine if it was printed successfully. As described above, in one embodiment, this analysis is performed for example, using an image system. In the present example, because test pattern 507A is printed successfully, thus initiating the YES branch from decision block 420, control system 540 executes a fetch of print data for a next sequential printing sub-process, and then initiates execution of this next sequential sub-process beginning with printing the associated feature (block 410 in FIG. 4).

Figure 6B:
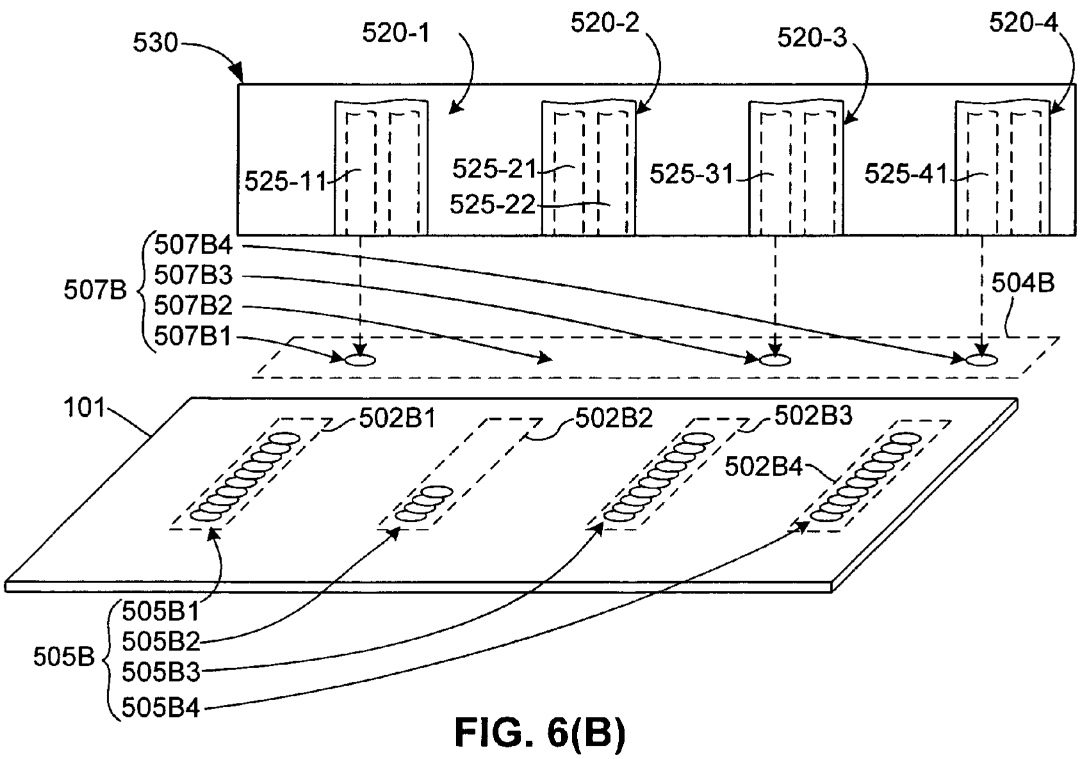

FIG. 6(B) depicts the incomplete (unsuccessful) execution of a printing sub-process, thus initiating the NO branch from decision block 420 (FIG. 4). In this example, the printing sub-process involves printing a feature that is essentially identical to feature 505A in selected regions 502B1 to 502B4. As indicated in FIG. 6(B), for purposes of this example, primary ejector 525-21 ceases operation during the printing of feature portion 505B2 in region 502B2 (feature portions 505B1, 505B3 and 505B4 are successfully printed in regions 502B1, 502B3 and 502B4, respectively, by primary ejectors 525-11, 525-31 and 525-41, respectively). Because primary printer 525-21 is now defective (inoperable), primary printer 525-21 fails to print associated test pattern 507B3, thus leaving a portion of test region 504B empty. During the subsequent test pattern detection/analysis, the absence of the associated test pattern portion is detected, thus initiating the NO branch from decision block 420 (FIG. 4). Further, consistent with block 430 of FIG. 4, the location of the missing droplet relative to successfully printed droplets 507B1, 507B3 and 507B4 facilitates identifying the location of defective primary ejector 525-21. As indicated in block 440, control device 540 deactivates primary ejector 525-21 and activates secondary ejector 525-22.

Figure 6C:
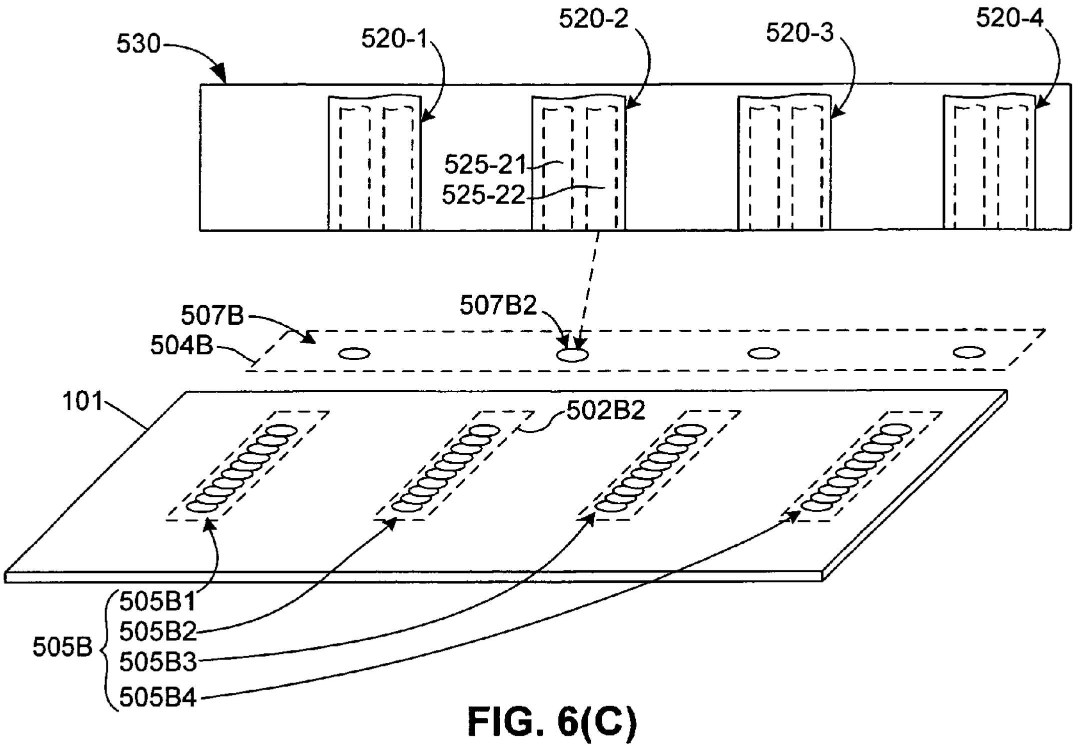
Figure 6D:
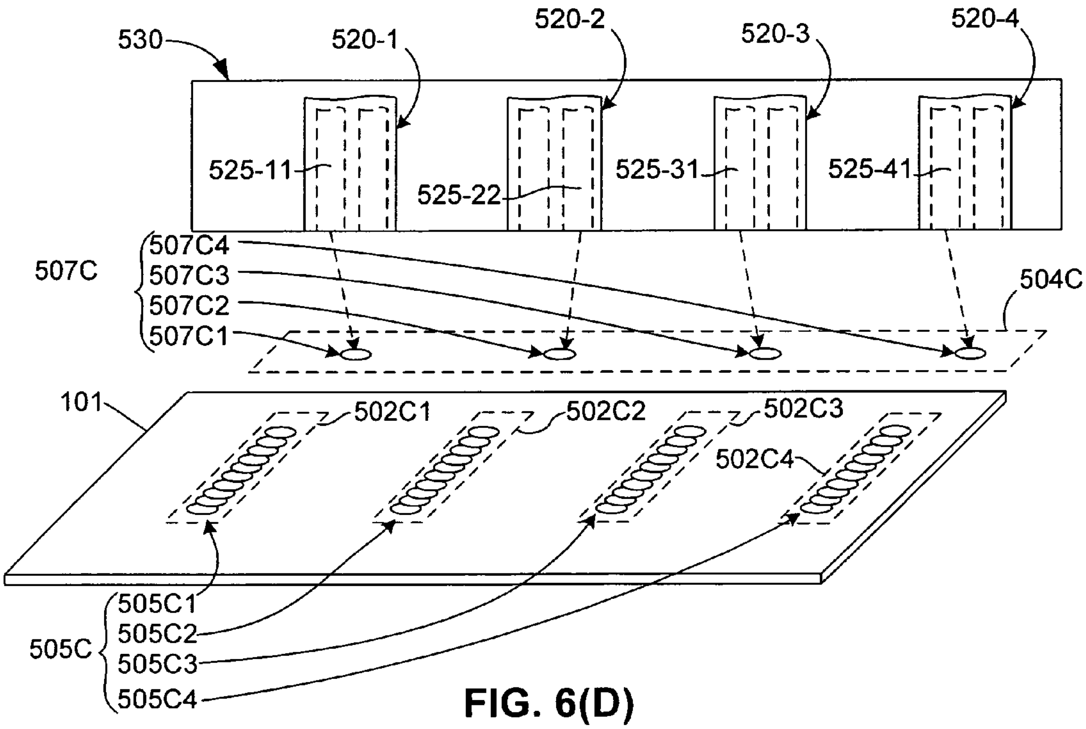

Next, as indicated in FIG. 6(C), control unit 540 controls secondary ejector 525-22 to print feature portion 505B2 onto region 502B2 (i.e., re-executing the current printing sub-process) while the remaining primary ejectors remain idle, thus correcting and completing feature 505B. In accordance with another aspect, secondary ejector 525-22 is also induced to print test pattern portion 507B2 onto test area 504B, thus completing test pattern 507B (which can then be analyzed as described above to verify that secondary ejector 525-21 is functioning properly). Finally, as indicated in FIG. 6(D), a subsequent feature 505C and test pattern 507C are printed using primary ejectors 525-11, 525-31 and 525-41 of printheads 520-1, 520-3 and 520-4, respectively.

Figure 7A:
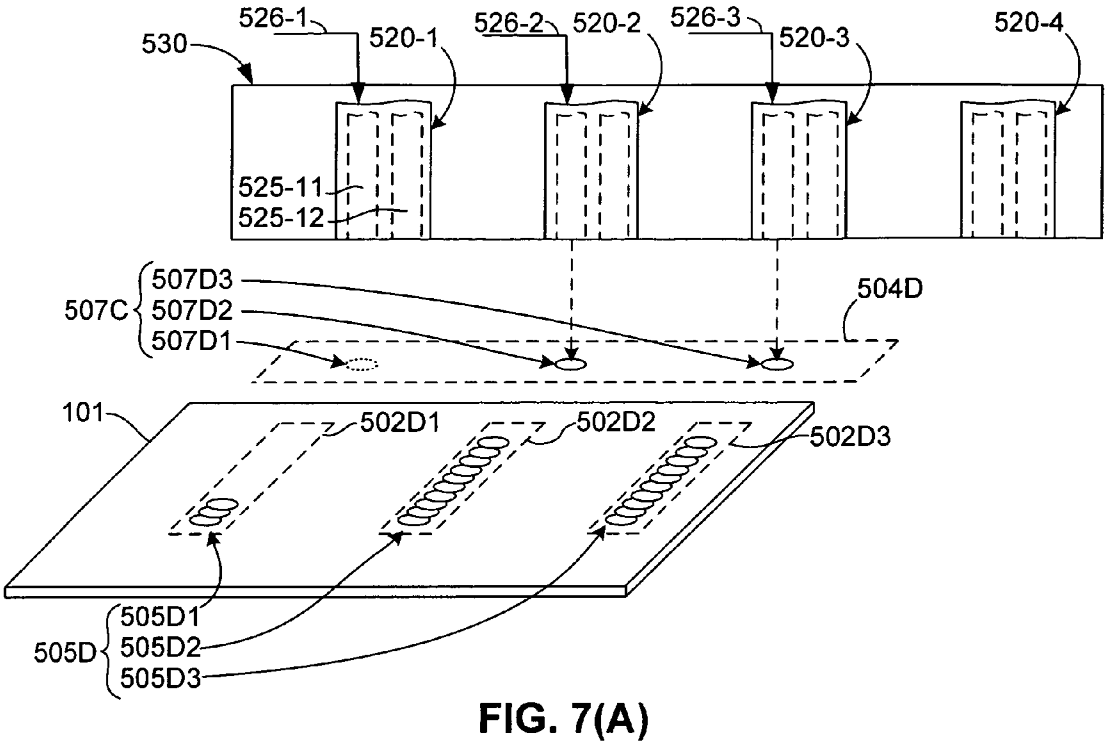
FIGS. 7(A) and 7(B) are simplified perspective views showing features and test patterns printed by the digital lithography system of FIG. 5 in accordance with another aspect of the present invention.
Figure 7B:
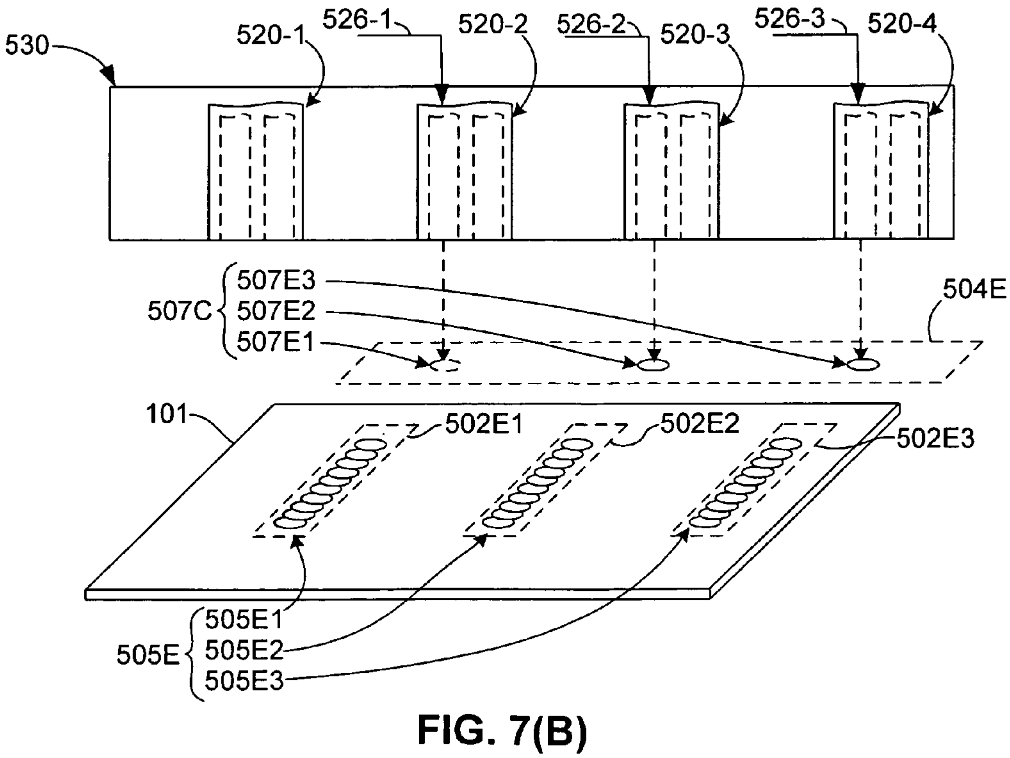

FIGS. 7(A) and 7(B) are simplified diagrams illustrating the partial production of a large-area electronic device using digital lithography system 500 of FIG. 5 in accordance with an alternative embodiment of the present invention. As indicated in FIG. 7(A), the production process includes a printing sub-process in which printheads 520-1 to 520-3 receive print data 526-1 to 526-3, respectively, which causes these printeads to print a feature 505D made up of three features portions 505D1 to 505D3 in selected regions 502D1 to 502D3 of substrate 101, and an associated test pattern 507D made up of three test pattern portions 507D1 to 507D3 in an associated test region 504D. In accordance with an aspect of the present embodiment, at least one printhead (e.g., printhead 520-4) is held in reserve (i.e., does not receive print data) during an initial portion of the printing process. In the specific example depicted on the left side of FIG. 7(A), printhead 520-1 is assumed to fail during the printing of feature portion 505D1, and subsequently fails to print test pattern portion 507D1. Similar to the embodiments provided above, when failure of primary ejector 525-11 of printhead 520-1 is detected, redundant ejector 525-12 is tasked to takes over the printing operation (i.e., driven by print data 526-1). In the present example, it is further assumed that both primary ejector 525-11 and redundant ejector 525-12 (along with any other redundant ejectors associated with printhead 520-1) have failed, thus constituting a complete failure of printhead 520-1. In accordance with the present embodiment, as indicated in FIG. 7(B), defective (failed) printhead 520-1 is deactivated, and the reserve printhead 526-4 is activated to provide the correct number of printheads such that the printing operation can be performed in one pass. In particular, because printheads 520-2 to 520-4 are grouped in a manner similar to printheads 520-1 to 520-3 (i.e., in a contiguous line), print data 526-1 is shifted from defective prinhead 520-1 to adjacent printhead 520-2, print data 526-2 is shifted to adjacent printhead 520-3, and print data 526-3 is shifted to reserve printhead 520-4. Note that printhead array 530 is shifted relative to substrate 101 to accommodate the new printhead assignments. As indicated in FIG. 7(B), subsequent printing of feature 505E takes place in one pass using printheads 520-2 to 520-4.

Figure 8A:
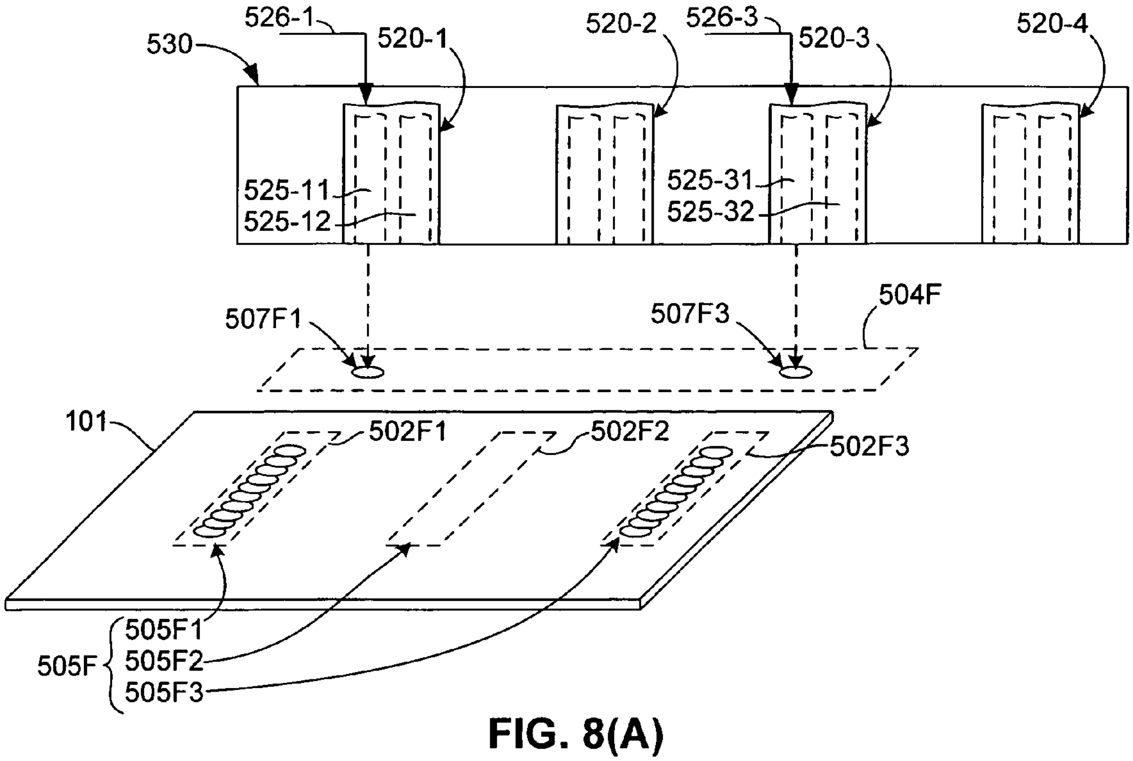
FIGS. 8(A) and 8(B) are simplified perspective views showing features and test patterns printed by the digital lithography system of FIG. 5 in accordance with another yet aspect of the present invention.
Figure 8B:
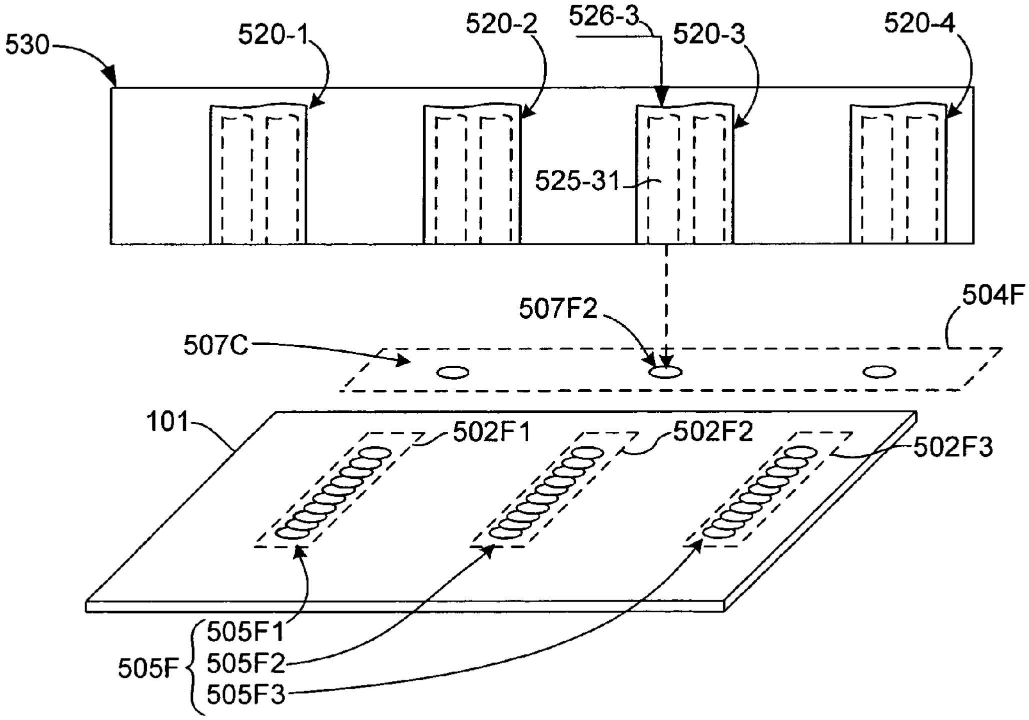

FIGS. 8(A) and 8(B) are simplified diagrams illustrating the partial production of a large-area electronic device using digital lithography system 500 of FIG. 5 in accordance with another alternative embodiment of the present invention. In this example, it is assumed that a printhead has failed in a position where shifting printhead assignments, as utilized in the embodiment described with reference to FIGS. 7(A) and 7(B), is not possible. For example, as depicted in FIG. 8(A), interior printhead 520-2 is assumed to have failed, thus preventing the ability for three contiguous printheads to print the desired feature 505F in one pass. In this case, the printing operation is performed in two passes, either using reserve printhead 520-4 to print the feature portion assigned to printhead 520-2, or using one of printheads 520-1 and 520-4 to perform "double duty" by printing the feature portion assigned to printhead 520-2 in the second pass. Thus, as indicated in FIG. 8(A), feature portions 505F1 and 505F3 of feature 505F are printed in a first pass by transmitting print data 526-1 and 526-3 to printheads 520-1 and 520-3, respectively. Then, as depicted in FIG. 8(B), printhead array 530 is shifted relative to substrate 101, and printhead 520-3 receives print data 526-2, thus causing printhead 520-3 to print feature portion 505-F2 in a second pass, thus completing feature 505F.

Note that the example described with reference to FIGS. 8(A) and 8(B) may also be used in digital lithography systems that does not include a redundant printhead, thus minimizing manufacturing costs. In addition, this method may also be used in a printing system that includes a multi-ejector printhead having ejectors arrayed in a linear manner (e.g., replacing each multi-ejector printhead 520 with a single ejector). Moreover, if multiple ejectors are lost, three or more printing passes using the remaining "good" ejectors may be used to complete each printing step, thereby further extending the operating life of the multi-ejector printhead.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for producing a large area electronic device by printing a plurality of features of the large-area electronic device on a substrate using a digital lithography system including a first ejector and a second ejector, the method comprising:

moving the first ejector over a first selected region of the substrate, and inducing the first ejector to print at least a portion of a first selected feature of the plurality of features onto the first selected region;

moving the first ejector from the first selected region of the device area to an associated test region, and inducing the first ejector to print at least a portion of a test pattern onto the associated test region, wherein the test region is remote from the first selected region;

determining whether said test pattern was either successfully printed or unsuccessfully printed in the associated test region;

when successful printing of the associated test pattern is determined, moving the first ejector over a second selected region of the substrate, and inducing the first ejector to print a second selected feature of the plurality of features onto the second selected region; and when unsuccessful printing of the associated test pattern is determined, moving the second ejector over the first selected region, and inducing the second ejector to print the first selected feature onto the first selected region.

2. The method according to claim 1, wherein the digital lithography system includes at least one inkjet printhead including the first ejector, and wherein inducing the first ejector to print the first selected feature comprises transmitting print data signals to the inkjet printhead.

3. The method according to claim 1, wherein the digital lithography system further comprises a platen for supporting the substrate, and wherein moving the first ejector from the first selected region to the associated test region comprises moving the platen relative to the first ejector.

4. The method according to claim 1, wherein the digital lithography system further comprises a platen for supporting the substrate, and wherein moving the first ejector from the first selected region to the associated test region comprises moving the first ejector relative to the platen.

5. The method according to claim 1, wherein inducing the first ejector to print a test pattern comprises inducing the first ejector to print the test pattern onto the substrate.

6. The method according to claim 1, wherein inducing the first ejector to print a test pattern comprises inducing the first ejector to print the test pattern onto a structure located adjacent to the substrate.

7. The method according to claim 1, wherein determining whether said test pattern was either successfully printed or unsuccessfully printed comprises generating image data for the associated test region and comparing the image data with stored image data.

8. The method according to claim 1, wherein the digital lithography system further comprises a third ejector, wherein inducing the first ejector to print the first selected feature and the test pattern comprises inducing the first ejector to print a first portion of the first selected feature and a first portion of the test pattern, and wherein the method further comprises inducing the third ejector to print a second portion of the first selected feature while the first ejector is induced to print the first portion of the first selected feature, and inducing the third ejector to print a second portion of the test pattern while the first ejector in induced to print the first portion of the test pattern.

9. The method according to claim 8, further comprising, upon determining that the test pattern was unsuccessfully printed, identifying a defective one of the first and third ejectors by determining which of the first and second portions of the test pattern are printed unsuccessfully.

10. A method for producing a large area electronic device by printing a plurality of features of the large-area electronic device on a substrate using a digital lithography system including a printhead array having first, second and third printheads, the method comprising:

moving the printhead array over a first selected region of the substrate, and inducing the first and second printheads to print at least a portion of a first selected feature of the plurality of features onto the first selected region, wherein the third printhead remains idle during printing of the first selected feature;

moving the printhead array from the first selected region to an associated test region, and inducing the first and second printheads to print an associated test pattern onto the associated test region, wherein the associated test region is remote from the first selected region;

determining whether said associated test pattern is either successfully printed or unsuccessfully printed in the associated test region;

when successful printing of the associated test pattern is determined, moving the printhead array over a second selected region of the substrate, and inducing the first and second printheads to print at least a portion of a second selected feature onto the second selected region; and when unsuccessful printing of the associated test pattern is determined:

identifying a defective printhead of the first and second printheads; and moving the printhead array over the second selected region of the substrate, and inducing a non-defective printhead of the first and second printheads and the third printhead to print the second selected feature.

11. A method for producing a large area electronic device by printing a plurality of features of the large-area electronic device on a substrate using a digital lithography system including a printhead array having first, second and third printheads, the method comprising:

moving the printhead array over a first selected region of the substrate, and inducing the first, second, and third printheads to print at least a portion of a first selected feature of the plurality of features onto the first selected region;

moving the printhead array from the first selected region to an associated test region, and inducing the first, second, and third printheads to print an associated test pattern onto the associated test region, wherein the associated test region is remote from the first selected region;

determining whether said associated test pattern is either successfully printed or unsuccessfully printed in the associated test region;

when successful printing of the associated test pattern is determined, moving the printhead array over a second selected region of the substrate, and inducing the first, second and third printheads to print at least a portion of a second selected feature onto the second selected region; and when unsuccessful printing of the associated test pattern is determined:

identifying the defective printhead of the first and second printheads;

moving the printhead array over the second selected region of the substrate, and inducing the non-defective printheads of the first, second and third printheads to print first and second portions of the second selected feature; and moving the printhead array over the second selected region of the substrate, and inducing a selected printhead of the non-defective printheads to print a third portion of the second selected feature.

12. A method for producing a large area electronic device by printing a plurality of features of the large-area electronic device on a substrate using a digital lithography system including a multi-ejector printhead having first, second and third ejectors, the method comprising:

moving the printhead over a first selected region of the substrate, and inducing the first, second, and third ejectors to print at least a portion of a first selected feature of the plurality of features onto the first selected region;

moving the printhead from the first selected region to an associated test region, and inducing the first, second, and third ejectors to print an associated test pattern onto the associated test region, wherein the associated test region is remote from the first selected region;

determining whether said associated test pattern is either successfully printed or unsuccessfully printed in the associated test region;

when successful printing of the associated test pattern is determined, moving the printhead over a second selected region of the substrate, and inducing the first, second and third ejectors to print at least a portion of a second selected feature onto the second selected region; and when unsuccessful printing of the associated test pattern is determined:

identifying the defective ejector of the first and second ejectors;

moving the printhead over the second selected region of the substrate, and inducing the non-defective ejectors of the first, second and third ejectors to print first and second portions of the second selected feature; and moving the printhead over the second selected region of the substrate, and inducing a selected ejector of the non-defective ejectors to print a third portion of the second selected feature.

* * * * *

UNITED STATES PATENT AND TRADEMARK OFFICE

CERTIFICATE OF CORRECTION

PATENT NO. : 7,514,114 B2
APPLICATION NO. : 11/218416
DATED : April 7, 2009
INVENTOR(S) : William S. Wong et al.

It is certified that error appears in the above-identified patent and that said Letters Patent is hereby corrected as shown below:

In the Specification

Column 1, line 7, please delete "70NANBOH3033" and insert -- 70NANB7H3029 --.

Signed and Sealed this
Tenth Day of September, 2013

Teresa Stanek Rea
*Acting Director of the United States Patent and Trademark Office*